(12) United States Patent
Chung

(10) Patent No.: US 6,267,288 B1
(45) Date of Patent: Jul. 31, 2001

(54) PALLET FOR COMBINED SURFACE MOUNT AND WAVE SOLDER MANUFACTURE OF PRINTED CIRUITS

(76) Inventor: Henry Chung, 3478 Del Norte Dr., San Jose, CA (US) 95132

( * ) Notice: Subject to any disclaimer, the term of this patent is extended or adjusted under 35 U.S.C. 154(b) by 0 days.

(21) Appl. No.: 09/420,181

(22) Filed: Oct. 18, 1999

(51) Int. Cl.[7] .............................. B23K 37/04; B25B 5/00
(52) U.S. Cl. .................................. 228/44.7; 269/254 CS; 269/254 R; 269/43
(58) Field of Search ........................... 228/180.21, 213, 228/255, 260, 44.7, 254 CS, 254 R, 43; 29/840; 414/941; 269/903, 254 CS, 254 R, 43; 118/503

(56) References Cited

U.S. PATENT DOCUMENTS

| | | | |
|---|---|---|---|
| 4,585,157 | * | 4/1986 | Belcher . |
| 5,577,657 | * | 11/1996 | Glovatsky . |
| 5,759,269 | * | 6/1998 | Cutting et al. . |
| 5,785,307 | * | 7/1998 | Chung . |
| 5,820,013 | * | 10/1998 | Ortiz . |
| 6,012,713 | * | 1/2000 | Gleason et al. . |
| 6,068,174 | * | 5/2000 | Ball et al. . |

* cited by examiner

Primary Examiner—Patrick Ryan
Assistant Examiner—Jonathan Johnson
(74) Attorney, Agent, or Firm—Robert Samuel Smith

(57) ABSTRACT

A pallet for mounting components on a double sided PCB including a fab (panel) having a frame area surrounding a depression. A shoulder around the depression is dimensioned to support the fab. The fab is laid on the shoulder with the a group of components mounted in a previous reflow operation in the space between the depression and a first area of the fab. The print, pick and place and reflow operations are performed to mount a second group of components on the opposite side of the fab. The first area of the fab is shielded from the heat of the oven so that the first components do not separate from the fab during the second reflow step. Standoffs in the depression prevent sagging of the board. Another area of the pallet has a recessed area with cutouts for wave soldering components located on the third area of the fab.

6 Claims, 6 Drawing Sheets

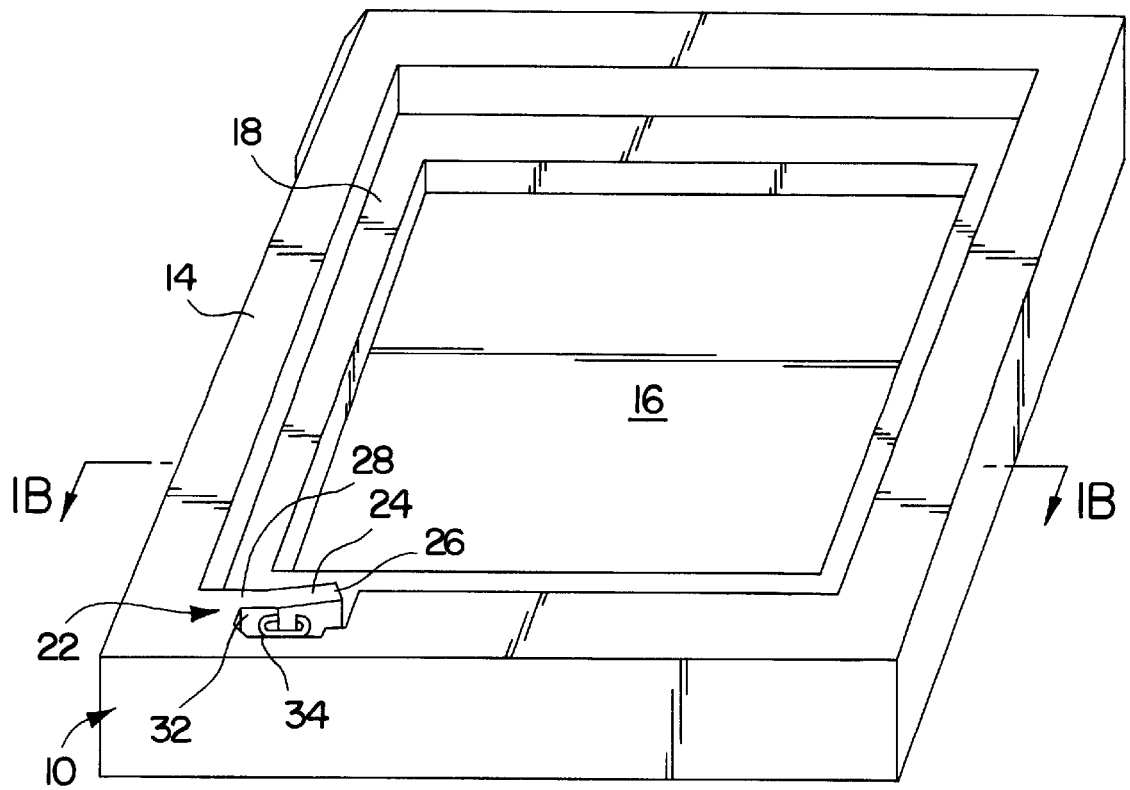
FIG. IA
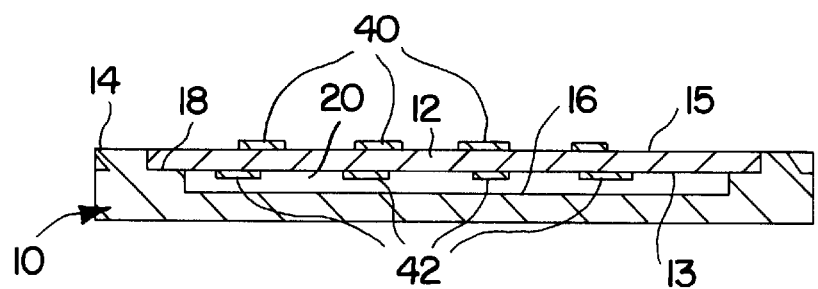
FIG. IB

FIG. 1 C

1. Mount a first group of components in a first area on one side of the fab using SMT.

2. Provide a pallet with depression and shoulder around the perimeter.

3. Position fab on the shoulder of the depression with first group of components occupying the space between the depression and the first area.

4. Deposit solder paste pattern in second area on opposite side of the fab.

5. Place second group of components on the printed pattern;

6. Pass fab on the pallet through reflow oven with selected temperature.

FIG. 2 C

Mount a first group of components in a first surface mount area on a first side of the fab;

Provide a pallet with depression in one area corresponding to the first surface mount area and a recess area with cutouts for wave soldering;

Position fab on pallet with the first group of components occupying the space between the depression and the fab;

Mount second group of components on second surface wherein temperature in the space between the depression and the first area is prevented from reaching the melting temperature of the solder by shielding from the depression area of the pallet;

Position wave solder group of components in third area on the first side of the fab with leads from the wave solder group of components extending through apertures in the fab into the cutout region of the pallet and expose to wave solder.

PALLET FOR COMBINED SURFACE MOUNT AND WAVE SOLDER MANUFACTURE OF PRINTED CIRUITS

FIELD OF THE INVENTION

This invention relates to apparatus for assembling components on printed circuit boards (PCB) and particularly to a fixture that supports the double sided PCB through surface mount technology (SMT) and wave solder processes.

BACKGROUND AND INFORMATION DISCLOSURE

The technology for manufacturing circuits comprising components mounted on printed circuit boards has evolved continuously during the past fifty years keeping pace with the evolution of discrete semiconductor devices to present high density integrated circuits.

The current "surface mount technology" (SMT) is applied to printed circuit boards (PCB) that have a plurality of layers of wiring with contact points from each layer extending up to "pads" located on the top and bottom surfaces of the board. Components are soldered to the pads.

The process starts with a bare board referred to as a fab which has been manufactured with layered wiring and surface art comprising exposed pads. The fab is loaded into the printing machine utilizing a stencil to print solder paste on the pattern of pads on the fab. Then the fab is conveyed to a "pick-n-place" machine which places components in position on the fab. Then the fab is placed in a "reflow" oven where the solder is melted and then allowed to cool so that the components are now securely soldered to the fab.

A common requirement for all of these processes is that each fab must be supported as it is carried through each step of the process. This is generally accomplished in the industry by mounting the fab on a supporting pallet which is designed for a specific station and is unique to that specific fab.

The state of the art SMT pallets used in the reflow step have an opening framed by a shoulder for supporting the board over the opening. The tolerance between the step down wall of the shoulder and the board is typically 0.015" to allow for differential expansion between the pallet and board.

The double sided PCB has the problem that, in a reflow operation, components soldered to one side of the board during a first reflow step can fall off the board when the board is turned over for the second reflow step.

SUMMARY

It is an object of the invention to provide a pallet that can support the fab in all three steps of the SMT operation including print, pick and place, and reflow.

It is an object of the invention to provide a pallet that supports a double sided fab in a secondary reflow operation and prevents the components installed on one side of the fab during a first pick-and-place and reflow operation from dropping off the fab when the fab is turned over to perform the second reflow operation.

Another object is to provide a supporting pallet that is characterized by more uniform heat distribution during the reflow operation so that thinner PCBs (typically, 0.020" thick) can be manufactured that are not subject to intolerable warping.

It is a further object that the pallet and its use have certain advantages compared to pallets that are presently used for this purpose. These advantages include:

quick and accurate replacement of each fab on pallet;
minimizing heat loss from conduction of heat into the pallet by features of the invention that permit use of thinner material for the fab;
minimizing warpage of the fab and pallet holding the fab during the solder reflow step;
manufacturing a PCB that combines surface mount technology and wave solder technology;

This invention is directed toward a pallet having a depression with a shoulder on at least two opposite sides of the depression so that a space is defined between the PCB supported on the shoulders and the surface of the depression. When the pallet supporting a PCB is placed in a solder reflow oven, the "down" side of the PCB (facing the depression) is shielded from the the direct heat of the oven, the surface temperature of the PCB facing the space is therefore less than temperature outside the space. In practice, power supplied to heat the oven is adjusted so that the temperature in the space is below the melting temperature of the solder paste applied to the PCB so that a first group of components mounted and soldered to the downside of the PCB will not fall off the PCB in a subsequent reflow step to secure a second group of components to the topside of the fab.

Another application of this feature is in manufacturing a board requiring a combination of first group of components mounted by surface mount technology in a first area and a second group of components mounted by solder wave technology in a second area. The pallet of this invention used in this situation has a depression formed in a corresponding first area and openings to admit a solder wave in the corresponding second area so that during a wave solder step applying solder to the second group of components, the first group of components is protected by the depression.

Anther set of circumstances applies to a fab that is thin (0.020") compared to the present standard fab (0.060"). According to an embodiment of the invention, an array of standoffs are formed in the depression which support such fabs and prevent sagging during the reflow operation. The array of standoffs are arranged to avoid interference with components placed on the PCB in an initial surface mount operation and which now face the depression in the second reflow step.

BRIEF DESCRIPTION OF THE DRAWINGS

FIG. 1A is a perspective view of a pallet to support a fab in a surface mount manufacturing process, according to the invention.

FIG. 1B is a sectional view of FIG. 1A.

FIG. 1C lists steps in using the pallet of FIGS. 1A,B.

FIG. 2C lists steps in using the pallet of FIGS. 2A,B.

DESCRIPTION OF PREFERRED EMBODIMENTS

Figure 2A:
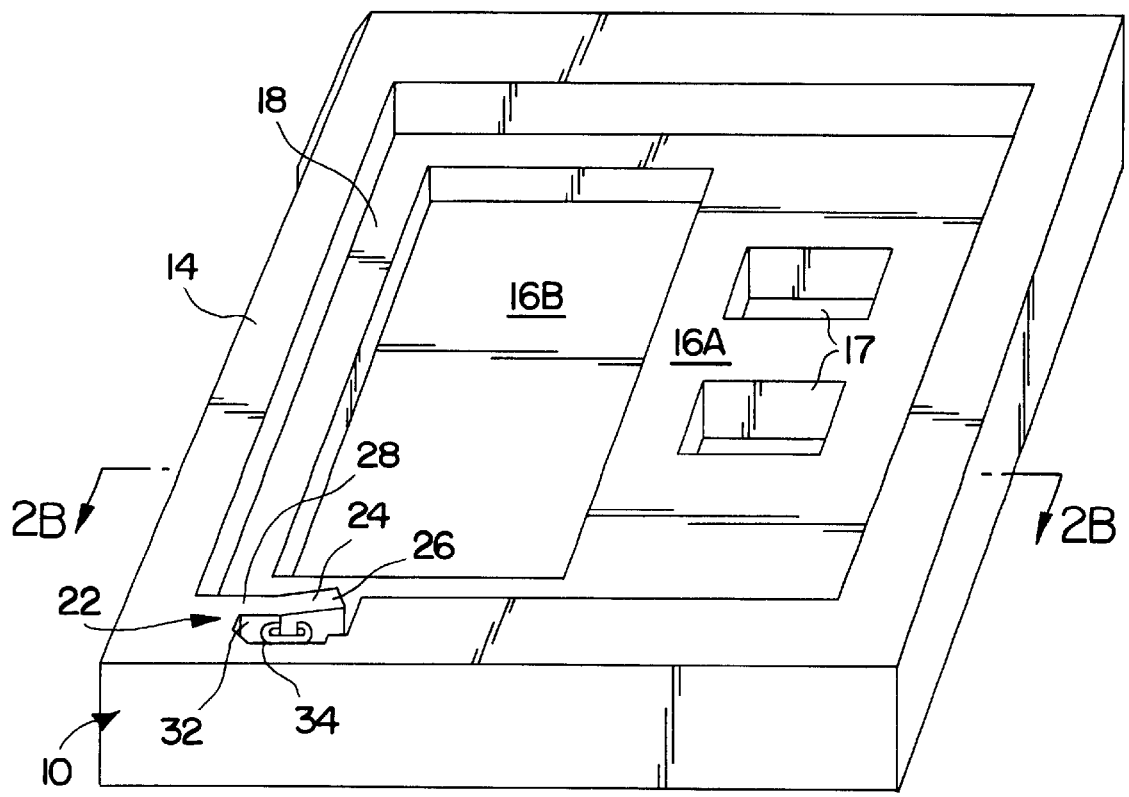
FIG. 2A is a perspective view of a pallet to support a fab in a combined surface mount and wave solder manufacturing process. according to the invention.

Turning now to a discussion of the drawings, FIG. 1A is a perspective view and FIG. 1B is a sectional view of a pallet 10 of one embodiment of this invention for supporting a fab 12 in a surface mount process that includes a print step, a pick and place step and a reflow step.

There is shown a pallet 10 (flat panel) being a rectangular outer frame 14 surrounding a depression 16. The depression has a shoulder 18 on its perimeter. As shown in FIG. 1B, the depression 16 is dimensioned so that the shoulder 18 supports a fab 12 and a space 20 is defined between the fab 12 (PCB) and the surface of the depression 16. The depth of the shoulder equals the thickness of the fab so that the top surface of the fab is coplanar with the top surface of the frame area of the fab.

A clamp 22 is formed in the frame against the side of the depression 16 for securing the fab on the pallet 14. There is shown a finger 24 formed by cutting out a portion of the frame 14 at the edge of the depression 16. The finger 24 has one end 28 integrally joined to the frame 14 and a free end 26 that is forced against the fab 12. thereby retaining the fab on the shoulder 18 over the depression 16. A recess 32 adjacent the finger 24 in the frame 14 holds a spring 34 which forces finger 24 against the edge of fab 12.

An advantage of the clamp 22 is that the clamp does not extend above the top surface of the frame 14. Therefore the pallet of FIG. 1A can be used in the print and the pick and place steps (as well as the reflow step) where accurate positioning by the print and pick and place operations is required.

FIG. 1B shows one array of components 42 on the bottom side of the fab 12 mounted in a primary SMT process. During the primary SMT operation, the side 13 of fab 12 holding components 42 is face up to receive the direct heat of the reflow oven without falling off the fab. Then the fab was turned up so that side 15 now faces up as shown in FIG. 1B.

Components 40 were mounted onto side. 15 with components 42 now positioned in space between the depression and underside of fab 12 as shown in FIG. 1B. When the fab 12 passes through the reflow oven the second time to secure components 40, components 42 are shielded from the direct heat of the oven and remain adhered to side 13 of fab 12.

FIG. 1C lists the steps for manufacturing a fab applying surface mount technology with the board of FIG. 1A according to the invention.

In step 1 a first group of components is mounted in a first area on one side of the fab using print, pick and place, and reflow techniques known in the industry.

In step 2, a pallet is provided which may be the same pallet used in step 1 having a depression in one area corresponding to the first area of the fab and having a shoulder around the perimeter of the depression dimensioned to support the fab.

In step 3 the fab is positioned on the shoulder of the depression with the first group of components occupying the space between the depression and the first area.

In step 4, a pattern of solder paste is deposited in a second area on the side of the fab opposite the first group of components.

In step 5, a second group of components is placed on the printed pattern;

In step 6, the fab on the pallet is passed through a reflow oven having a temperature wherein the the second group is soldered to the fab. During the second reflow step, temperature in the space between the depression and the first area is prevented from reaching the melting temperature of the solder by shielding from the depression area of the pallet so that the components secured during the first reflow step remain intact.

Figure 2B:
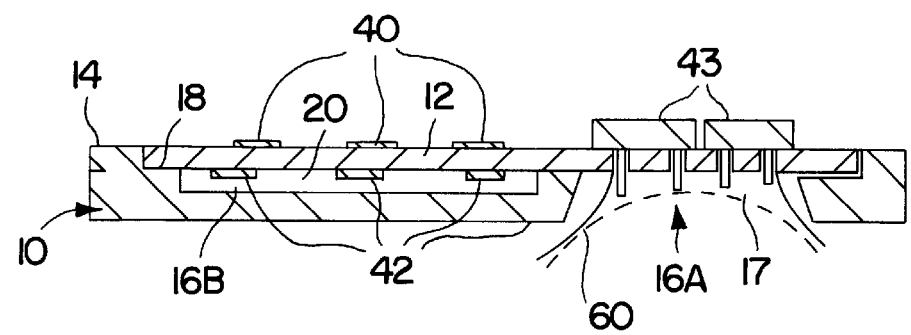
FIG. 2B is a sectional view of FIG. 2A.

FIG. 2A is a perspective view and FIG. 2B is a sectional view showing a pallet 11 of the invention for using SMT to mount a first group of components 42 on one side 13 of the fab 12, and a second group of components on the opposite side 15, as described above, and using wave soldering to mount a third group of components 43 in another area of side 13. There is shown one area 16B of the pallet having the depression described above and a second area 16A having openings 17 for admitting a solder wave.

In the second SMT operation performed to mount the second group of components 40, the fab carrying the first group of components 42 is laid on the pallet with the first group of components 42 secured to the fab 12 and occupying the space between the depression 16B and fab 12. The components 42 are protected from heat from the crest 60 of the solder wave during the wave solder operation.

FIG. 2C lists the steps for manufacturing a fab using the pallet 11 of FIGS. 2A and 2B applying combined surface mount and solder wave technology according to the invention.

In step 1 a first group of components is mounted in a first surface mount area on a first side of the fab using print, pick and place, and reflow techniques according to SMT techniques.

In step 2, a pallet is provided which may be the same pallet used in step 1 and having a depression in one area corresponding to the first surface mount area of the fab and another area with cutouts corresponding to the area of the fab where components are to be mounted using wave solder techniques.

In step 3 the fab is positioned on the pallet with the first group of components occupying the space between the depression and the fab.

In step 4, a second group of components is mounted on the second (opposite) surface using SMT techniques. The first group of components is prevented from falling off the (bottom) first surface by occupying the space between the fab and the depressed surface of the pallet where the temperature in this space is prevented from reaching the melting temperature of the solder by shielding from the depression area of the pallet.

In step 5, a third group of components mounted on the fab are wave soldered to the fab through apertures in the pallet. The crest of a solder wave is impinged through the apertures thereby soldering the extended leads of the wave solder group of components to the fab while both groups of surface mount components are protected from the heat from the solder.

Figure 3A:
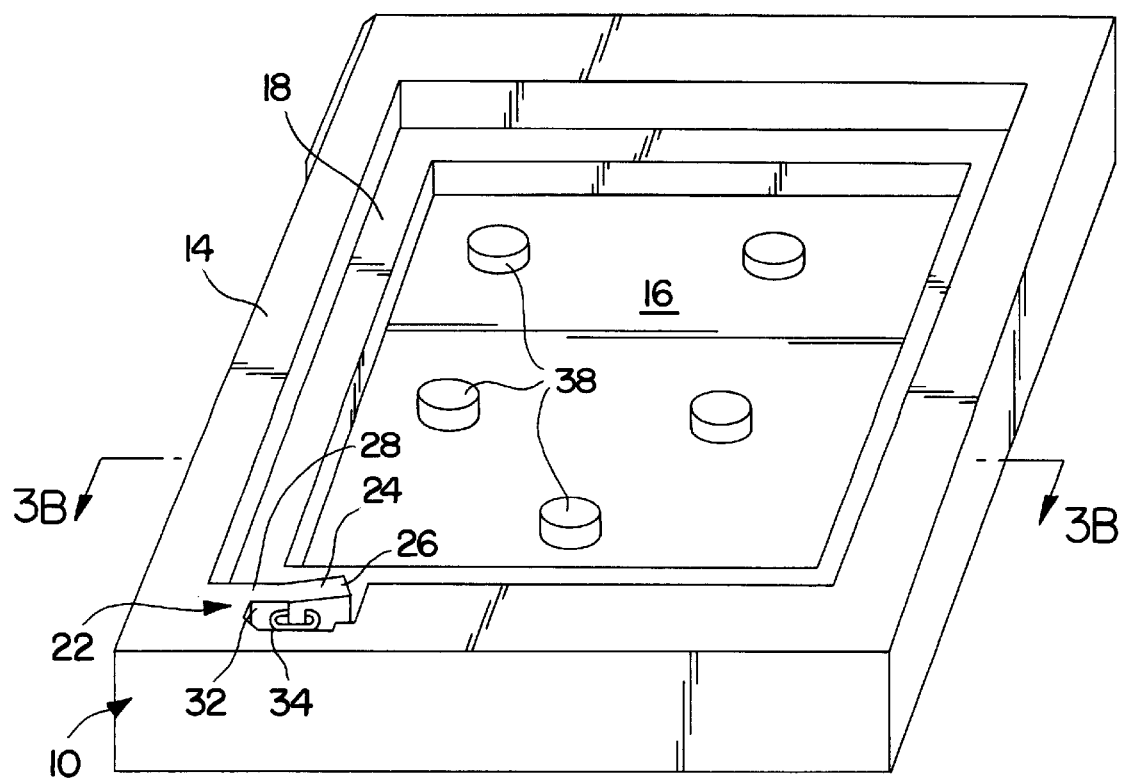
FIG. 3A is a perspective view showing a pallet for supporting a very thin fab in a surface mount set of steps.
Figure 3B:
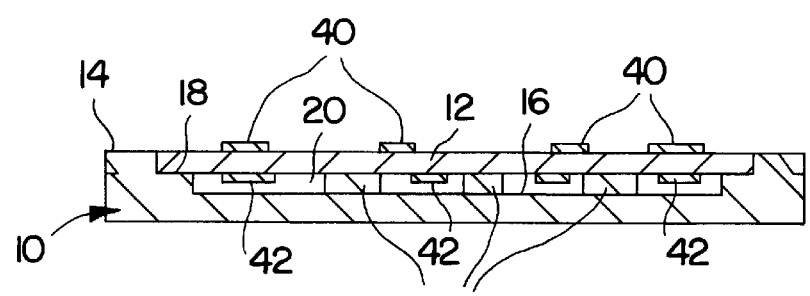
FIG. 3B is a sectional view of FIG. 3A

FIG. 3A is a perspective view and FIG. 3B is a sectional view showing a pallet of this invention for use with very thin fab 12 (0.020" thick) which overcomes the problem of warpage of the thin fab during the reflow step. In this embodiment, in addition to the features of FIGS. 1 and 2, an array of standoffs 38 are arranged on the floor of the depression. The array of standoffs 38 is arranged to avoid contact with components 42 mounted on the underside of the fab 12 during the earlier reflow operation.

Figure 4A:
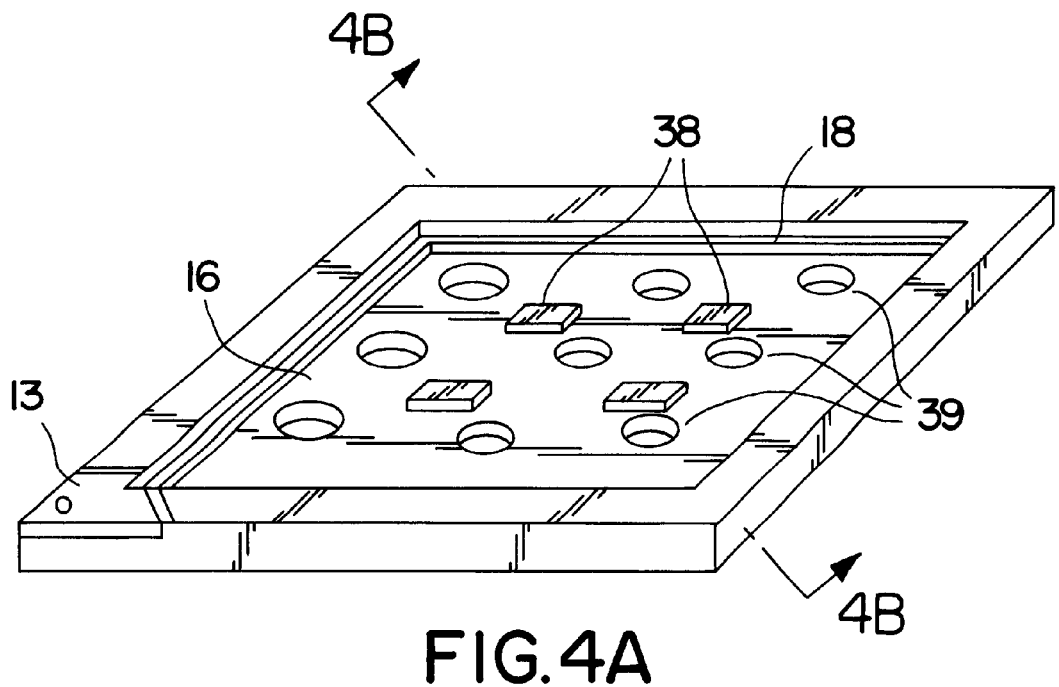
FIG. 4A is a perspective view showing a pallet for supporting a very thin PCB in a surface mount set of steps with apertures to provide even temperature.
Figure 4B:
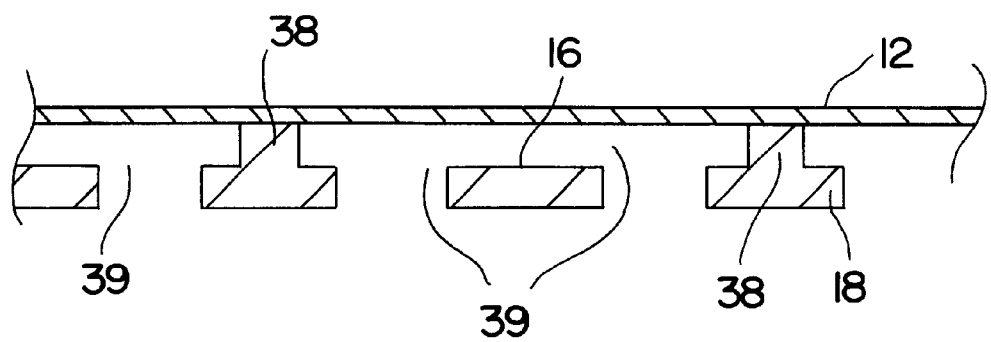
FIG. 4B is a sectional view of FIG. 4A.

FIG. 4A is a perspective view and FIG. 4B is a sectional view shows a pallet of this invention for use in overcoming uneven heating in the space between the fab 12 and the depression 16. There is shown, in addition to the array of standoffs 38 an array of holes 39, formed in the pallet on the floor of the depression which are positioned according to the temperature pattern in the oven to provide a more even temperature in the space between the depression 16 and the fab 12.

There has been described a pallet with which a double sided PCB is manufactured by surface mount technology or combined surface mount and wave solder technology. The single pallet can be used in all the steps of printing, pick and place, reflow and wave soldering. Another feature prevents warping of the fab due to exposure to heat.

Variations and modifications of the invention may be suggested by reading the specification and studying the drawings which are within the scope of the invention. I therefore wish to define the scope of my invention by the appended claims.

I claim:

1. A pallet for supporting a fab in a surface mount manufacturing operation wherein manufacturing a double sided PCB requires mounting a first group of components on one side of a fab and mounting a second group of components on an opposite side of the fab using the techniques of:

(i) printing a pattern of solder paste on each side of the fab;

(ii) placing the first and second groups of components on the respective sides of the fab;

(iii) heating the fab to a temperature where the solder paste melts enabling each group to adhere to the fab when the temperature is reduced to ambient temperature;

said pallet comprising:

a panel having a frame area (14) surrounding a depression area (16);

a shoulder (18) having a shoulder surface and located on a perimeter of said depression area;

said depression area and shoulder dimensioned to support the fab positioned on said shoulder surface with a top surface of said fab coplanar with a top surface of said frame area and defining a space between a surface of said depression area and an area of the fab extending over said depression area;

a finger (24) formed by cutting out a portion of the frame area (14) at the edge of the depression area (16);

said finger (24) having one end (28) integrally joined to said frame area (12) and a free end (26) biased toward the depression area providing that the fab on said shoulder (18) over depression (16) is retained on said shoulder (18) by said finger pressing against said fab.

2. The pallet of claim 11 further comprising a recess adjacent the finger in the frame area holding a spring biasing said finger toward said depression area.

3. The pallet of claim 11 further comprising an array of standoffs (38) positioned on said area of said depression in said space and having a height selected to support said fab positioned on said shoulder providing that, during reflow step, said fab (12) is supported by said standoffs (38) and prevented from sagging.

4. A pallet for supporting a fab in a surface mount manufacturing operation wherein manufacturing a double sided PCB requires mounting a first group of components on one side of a fab and mounting a second group of components on an opposite side of the fab using the techniques of:

(i) printing a pattern of solder paste on each side of the fab;

(ii) placing the first and second groups of components on the respective sides of the fab;

(iii) heating the fab to a temperature where the solder paste melts enabling each group to adhere to the fab when the temperature is reduced to ambient temperature;

said pallet comprising:

a panel having a frame area (14) surrounding a depression area (16);

a shoulder (18) having a shoulder surface and located on a perimeter of said depression area;

said depression area and shoulder dimensioned to support the fab positioned on said shoulder surface with a top surface of said fab coplanar with a top surface of said frame area and defining a space between a surface of said depression area and an area of the fab extending over said depression area;

an array of openings (39) in said depression area arranged to evenly distribute heat in said space during a reflow cycle.

5. The pallet of claim 4 which further comprises:

an array of standoffs positioned on said area of said depression in said space and having a height selected to support said fab positioned on said shoulder providing that, during reflow step, said fab is supported by said standoffs and prevented from sagging; and an array of openings in said depression area arranged to evenly distribute heat in said space during a reflow cycle.

6. The pallet of claim 4 further comprising:

a recess area of said pallet located within said frame and having a surface coplanar with said shoulder surface;

at least one cutout aperture in said recess area located to correspond to locations on said fab for mounting a third group of components by wave soldering by exposing to a crest of a solder wave the leads extending through said fab from said third group of components positioned at said locations on the topside of the fab.

* * * * *